(12) United States Patent
Tamarkin et al.

(10) Patent No.: US 10,176,143 B2
(45) Date of Patent: Jan. 8, 2019

(54) PERIPHERAL COMPONENT INTERCONNECT EXPRESS (PCIE) CARD HAVING MULTIPLE PCIE CONNECTORS

(71) Applicant: Intel Corporation, Santa Clara, CA (US)

(72) Inventors: Vladimir Tamarkin, Huntingdon Valley, PA (US); Wayne Genetti, Sanatoga, PA (US); David Schweitzer, Collegeville, PA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/621,825

(22) Filed: Jun. 13, 2017

(65) Prior Publication Data

US 2017/0286353 A1  Oct. 5, 2017

Related U.S. Application Data

(63) Continuation of application No. 14/569,041, filed on Dec. 12, 2014, now Pat. No. 9,710,421.

(51) Int. Cl.
*G06F 1/18* (2006.01)
*G06F 13/42* (2006.01)
(Continued)

(52) U.S. Cl.
CPC ............ *G06F 13/4282* (2013.01); *G06F 1/16* (2013.01); *G06F 1/185* (2013.01); *G06F 1/186* (2013.01);
(Continued)

(58) Field of Classification Search
CPC . G06F 1/16; G06F 1/185; G06F 1/186; G06F 13/409; G06F 2213/0026;
(Continued)

(56) References Cited

U.S. PATENT DOCUMENTS 5,572,688 A  11/1996 Sytwu
7,631,134 B2  12/2009 Jian
(Continued)

FOREIGN PATENT DOCUMENTS

CN  102841643 A  12/2012
CN  105701050 A   6/2016
(Continued)

OTHER PUBLICATIONS

Jackson, Joab; "Epic Interconnect Clash! InfiniBand vs. Gigabit Ethernet"; NetworkWorld; Dec. 3, 2012. accessed Apr. 10, 2018 <https://www.networkworld.com/article/2161678/lan-wan/epic-interconnect-clash--infiniband-vs--gigabit-ethernet.html>.*
(Continued)

*Primary Examiner* — Glenn A. Auve
(74) *Attorney, Agent, or Firm* — Alliance IP, LLC

(57) ABSTRACT

Some embodiments include apparatus and methods having a circuit board, a device located on the circuit board, a first Peripheral Component Interconnect Express (PCIe) connector located on the circuit board and coupled to the device, and a second PCIe connector located on the circuit board and coupled to the device. The first PCIe connector is arranged to couple to a first connector of an additional circuit board. The second PCIe connector is arranged to couple to a second connector of the additional circuit board.

6 Claims, 3 Drawing Sheets

(51) Int. Cl.
  *H01R 12/71* (2011.01)
  *H01R 12/72* (2011.01)
  *H01R 12/73* (2011.01)
  *H05K 1/14* (2006.01)
  *H05K 7/14* (2006.01)
  *G06F 1/16* (2006.01)
  *H05K 5/02* (2006.01)
  *H05K 3/30* (2006.01)
  *H05K 1/02* (2006.01)
  *G06F 13/40* (2006.01)

(52) U.S. Cl.
  CPC ........ *G06F 13/409* (2013.01); *G06F 13/4022* (2013.01); *H01R 12/716* (2013.01); *H01R 12/721* (2013.01); *H01R 12/722* (2013.01); *H01R 12/727* (2013.01); *H01R 12/73* (2013.01); *H01R 12/737* (2013.01); *H05K 1/0296* (2013.01); *H05K 1/145* (2013.01); *H05K 3/308* (2013.01); *H05K 5/0286* (2013.01); *H05K 7/1422* (2013.01); *G06F 2213/0026* (2013.01); *H05K 2201/10* (2013.01)

(58) Field of Classification Search
  CPC .. H05K 1/145; H05K 1/0296; H05K 2201/10; H05K 3/308; H05K 5/0296; H05K 7/1422; H01R 12/727; H01R 12/722; H01R 12/716; H01R 12/73; H01R 12/737
  See application file for complete search history.

(56) References Cited

U.S. PATENT DOCUMENTS

| | | | |
|---|---|---|---|
| 8,423,695 B2 | 4/2013 | Purwin | |
| 8,520,401 B2 | 8/2013 | Tian et al. | |
| 8,601,196 B2 | 12/2013 | Sun | |
| 9,436,630 B2 | 9/2016 | Yousuf | |
| 9,710,421 B2 | 7/2017 | Tamarkin et al. | |
| 9,842,075 B1* | 12/2017 | Davis | G06F 13/385 |
| 2006/0294279 A1 | 12/2006 | McKee et al. | |
| 2007/0214299 A1 | 9/2007 | Lo | |
| 2008/0059678 A1 | 3/2008 | Jian | |
| 2012/0021624 A1 | 1/2012 | Tuma et al. | |
| 2012/0320551 A1 | 12/2012 | Sun | |
| 2013/0042041 A1 | 2/2013 | Sun | |
| 2013/0044450 A1 | 2/2013 | Tian et al. | |
| 2013/0179621 A1 | 7/2013 | Smith et al. | |
| 2013/0325998 A1* | 12/2013 | Hormuth | G06F 15/17331 709/212 |
| 2014/0129753 A1 | 5/2014 | Schuette et al. | |
| 2015/0237058 A1* | 8/2015 | Chritz | H04L 63/1408 726/23 |
| 2015/0282319 A1 | 10/2015 | Salzman et al. | |
| 2016/0043484 A1 | 2/2016 | Brodsky et al. | |
| 2016/0170928 A1 | 6/2016 | Tamarkin et al. | |
| 2018/0004615 A1* | 1/2018 | Breakstone | G06F 13/4282 |

FOREIGN PATENT DOCUMENTS

| | | |
|---|---|---|
| EP | 1684186 A1 | 7/2006 |
| JP | 2002149408 A | 5/2002 |
| JP | 2005190297 A | 7/2005 |
| JP | 2007316722 A | 12/2007 |
| JP | 2016115922 A | 6/2016 |
| KR | 1020140110004 A | 9/2014 |
| WO | WO-9610792 A1 | 4/1996 |

OTHER PUBLICATIONS

"U.S. Appl. No. 14/569,041, Non Final Office Action dated Nov. 17, 2016", 12 pgs.
"U.S. Appl. No. 14/569,041, Notice of Allowance dated Mar. 13, 2017", 5 pgs.
"U.S. Appl. No. 14/569,041, Response filed Feb. 17, 2017 to Non Final Office Action dated Nov. 17, 2016", 13 pgs.
"European Application Serial No. 15194175.4, Extended European Search Report dated Jan. 12, 2016", 8 pgs.
"Japanese Application Serial No. 2015-202631, Office Action dated Nov. 8, 2016", W/ English Translation, 9 pgs.
"Japanese Application Serial No. 2015-202631, Response filed Feb. 4, 2017 to Office Action dated Nov. 8, 2016", w/ marked claims in English, 22 pgs.
"Korean Application Serial No. 2015-0157896, Office Action dated Apr. 28, 2017", W/ English Translation, 7 pgs.
"European Application Serial No. 17186221.2, Extended European Search Report dated Nov. 16, 2017", 7 pgs.
"Japanese Application Serial No. 2015-202631, Office Action dated Jul. 11, 2017", w/ English translation, 5 pgs.
"Japanese Application Serial No. 2015-202631, Response filed Oct. 10, 2017 to Office Action dated Jul. 11, 2017", w/ claims in English, 15 pgs.
"Korean Application Serial No. 2015-0157896, Response filed Jun. 26, 2017 to Office Action dated Apr. 28, 2017", w/ claims in English, 28 pgs.
SIPO Office Action issued in CN Patent Application No. 201510776843.5 dated Feb. 2, 2018 (11 pages).

\* cited by examiner

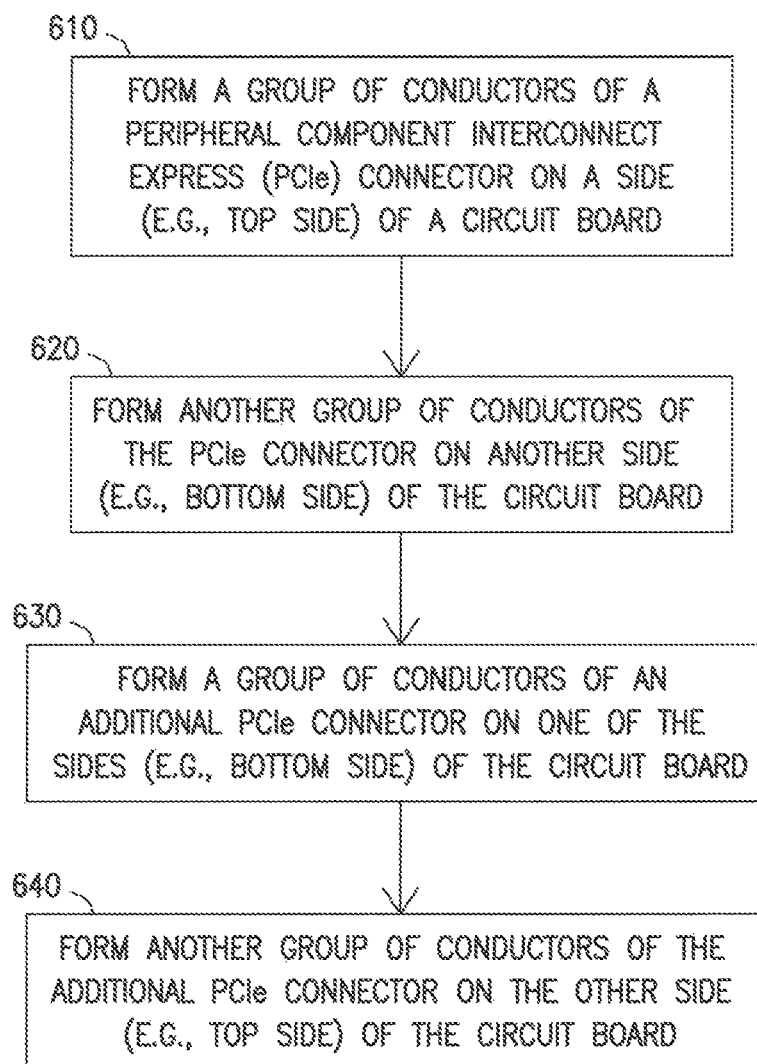

PERIPHERAL COMPONENT INTERCONNECT EXPRESS (PCIE) CARD HAVING MULTIPLE PCIE CONNECTORS

CROSS-REFERENCE TO RELATED APPLICATION

This application is a continuation of U.S. patent application Ser. No. 14/569,041, filed Dec. 12, 2014, which is incorporated by reference herein in its entirety.

TECHNICAL FIELD

Embodiments described herein pertain to Peripheral Component Interconnect Express (PCIe). Some embodiments relate to PCI express (PCIe) cards.

BACKGROUND

Many circuit boards (e.g., motherboards) of computers, such as servers, include PCIe slots. Each of the PCIe slots can be coupled to a PCIe connector of a PCIe card to allow additional functionality on the PCIe card to be added to the computers. A standard PCIe card has a single PCIe connector. In some situations, such a standard PCIe card may be unsuitable for use in some computers.

BRIEF DESCRIPTION OF THE DRAWINGS

FIG. 6 is a flowchart showing a method of making a PCIe card, according to some embodiments described herein.

DETAILED DESCRIPTION

Figure 1:
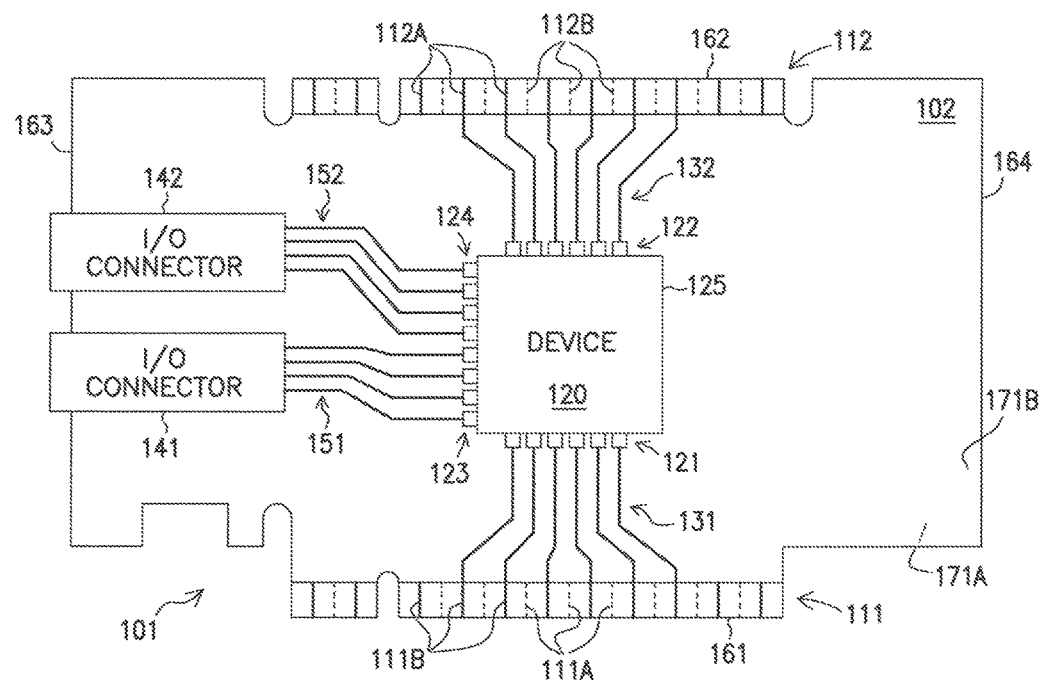
FIG. 1 shows an apparatus in the form of a PCIe card having multiple PCIe connectors, according to some embodiments described herein.

FIG. 1 shows an apparatus in the form of a PCIe card 101 having multiple PCIe connectors (e.g., ports) 111 and 112, according to some embodiments described herein. PCIe connectors 111 and 112 comply with PCIe specification. PCIe connectors 111 and 112 may be coupled to a PCIe bus on an additional circuit board (e.g., a motherboard of a computer) through two other PCIe connectors (e.g., two PCIe slots) located on the additional circuit board. In this description, PCIe specification refers to PCIe specification developed and maintained by the Peripheral Component Interconnect Special Interest Group (PCI-SIG) organization located in Portland, Oreg., in the United States of America.

PCIe card 101 of FIG. 1 may be an expansion card that conforms to a PCIe form factor. Examples of such an expansion card include a host adapter device (e.g., host bus adapter device), network interface controller (NIC) device, a converged network adapter device, and other types of expansion cards.

As shown in FIG. 1, PCIe card 101 may include a circuit board (e.g., printed circuit board (PCB)) 102 and a device 120 located on circuit board 102. An example of device 120 includes a controller device, such as an application specific integrated circuit (ASIC). Device 120 may support more than one PCIe port (e.g., PCIe connectors). For example, device 120 may be coupled to PCIe connector 111 through a connection 131 on circuit board 102 to support communication between device 120 and components on an additional circuit board (e.g., a motherboard) coupled to PCIe connector 111. Connection 131 may be part of an independent connection between device 120 and such components on the additional circuit board. Such an independent connection can include a dedicated connection, such as a point-to-point PCIe connection that allows electrical communication between device 120 and other components based on PCIe specification. In another example, device 120 may be coupled to PCIe connector 112 through a connection 132 on circuit board 102 to support communication between device 120 and components on the additional circuit board coupled to PCIe connector 112. Connection 132 may be part of another independent connection (e.g., another dedicated connection, such as another point-to-point PCIe connection) between device 120 and such components on the additional circuit board.

As shown in FIG. 1, PCIe card 101 may also include input/output (I/O) connectors 141 and 142 located on circuit board 102 and coupled to device 120 through connections (e.g., conductive paths) 151 and 152, respectively, on circuit board 102. Each of connectors 141 and 142 may be arranged to couple to other devices or systems (e.g., through a network). For example, connector 141 may be coupled to a device (or system) through a network connection. Connector 142 may be coupled to another device (or system) through another network. The networks coupled to connectors 141 and 142 may include different networks, such as Ethernet, Fibre Channel, and InfiniBand.

As shown in FIG. 1, circuit board 102 includes edges 161 and 162 opposite from each other, an edge 163 immediately adjacent one of edges 161 and 162, and an edge 164 immediately adjacent one of edges 161 and 162. PCIe connectors 111 and 112 may be located at edges 161 and 162, respectively. I/O connectors 141 and 142 may be located at edge 163. FIG. 1 shows an example where PCIe connectors 111 and 112 are located at opposite edges 161 and 162 of circuit board 102 as an example. In an alternative arrangement, one of PCIe connectors 111 and 112 (e.g., 111) may be located at edge 161 (or 162) and the other PCIe connector (e.g., 112) may be located at edge 163. However, locating PCIe connectors 111 and 112 at opposite edges (e.g., edges 161 and 162, as shown in FIG. 1) may allow more room for another PCIe component (e.g., a PCIe expander cable) to couple to one of PCIe connectors 111 and 112 (e.g., 112) after the other PCIe connector (e.g., 111) is inserted into a slot on an additional circuit board (e.g., a motherboard).

As shown in FIG. 1, circuit board 102 includes a side (e.g., bottom side) 171A and a side (e.g., top side) 171B opposite from side 171A. Each of PCIe connectors 111 and 112 may include conductors (e.g., electrical traces, such as metal-based traces) on both sides 171A and 171B of circuit board 102. For example, PCIe connector 111 may include conductors (a group of conductors) 111A located on side 171A and conductors (another group of conductors) 111B located on side 171B. Conductors 111A and 111B may be coupled to device 120 through connection 131. PCIe connector 112 may include conductors (a group of conductors) 112A located on side 171B and conductors (another group of conductors) 112B located on side 171A. Conductors 112A and 112B may be coupled to device 120 through connection 132. Since each of PCIe connectors 111 and 112 may include conductors located at an edge (e.g., edge 161 or 162) of circuit board 102, each of PCIe connectors 111 and 112 may include an edge-connector type.

Conductors 111A of PCIe connector 111 (on side 171A) and conductors 112A of PCIe connector 112 (on side 171B) may be arranged based on PCIe connector pin-out specification for a side (e.g., side A) of a PCB. For example, conductors 111A and 112A may have pin names associated with conductors on the solder side (side A) of the PCB based on PCIe connector pin-out specification.

Conductors 111B of PCIe connector 111 (on side 171B) and conductors 112B of PCIe connector 112 (on side 171A) may be arranged based on PCIe connector pin-out specification for the other side (e.g., side B) of the PCB. For example, conductors 111B and 112B may have pin names associated with conductors on the component side (side B) of the PCB based on PCIe connector pin-out specification.

In FIG. 1, sides 171A and 171B of circuit board 102 may correspond to a solder side (side A) and a component side (side B), respectively, of a PCB of a PCIe card in accordance with PCIe specification. Since conductors 111A and 111B of PCIe connector 111 have pin names based on sides A and B, respectively, of PCIe connector pin-out specification, and since conductors 111A and 111B are located on the solder and component sides, respectively, of the PCB board 102, conductors 111A and 111B follow the same arrangement specified by PCIe connector pin-out specification. In PCIe connector 112, since conductors 112A and 112B of PCIe connector 112 have pin names based on sides A and B, respectively, of PCIe connector pin-out specification, and since conductors 112A and 112B are located on the component and solder sides, respectively, of the PCB board 102, conductors 112A and 112B follow an arrangement that is opposite from the arrangement specified by PCIe connector pin-out specification.

Arranging conductors 112A and 112B of PCIe connector 112 on sides 171B and 171A (e.g., opposite from the arrangement specified by PCIe connector pin-out specification), respectively, may allow PCIe card 101 to couple to multiple PCIe slots of a motherboard using standard PCIe components (e.g., PCIe riser card and PCIe expander cable) and avoid flipping PCIe card 101 (e.g., flipping it 180 degrees) when it is coupled to multiple PCIe slots of the motherboard.

Device 120 of PCIe card 101 may be arranged (e.g., configured) to perform multiple different functions, such as functions based on different computer network standards. As shown in FIG. 1, device 120 may include integrated circuit (IC) chip (e.g., semiconductor chip) 125 where components (e.g., circuit elements) of device 120 may be located on IC chip 125 (e.g., formed in or on IC chip 125). IC chip 125 may include conductive contacts 121, 122, 123, and 124 coupled to connections 131, 132, 151, and 152, respectively. FIG. 1 shows an example where IC chip 125 includes 20 conductive contacts (six conductive contacts from each of conductive contacts 121 and 122, and four conductive contacts from each of conductive contacts 123 and 124). The number of conductive contacts of IC chip 125 may vary.

Each of connections 131, 132, 151, and 152 may include conductors (e.g., electrical traces, such as metal-based traces) on one or both sides (171A and 171B) of circuit board 102. Conductive contacts 121, 122, 123, and 124 may include solder balls, solder bumps, pins, or other types of conductive contacts. FIG. 1 shows an example of 20 conductors (e.g., 20 electrical traces) of connections 131, 132, 151, and 152. The number of conductors of connections 131, 132, 151, and 152 may vary.

As shown in FIG. 1, conductive contacts 121 may be coupled to PCIe connector 111 through connection 131. Conductive contacts 122 may be coupled to PCIe connector 112 through connection 132. Conductive contacts 123 may be coupled to connector 141 through connection 151. Conductive contacts 124 may be coupled to connector 142 through connection 152.

Conductive contacts 121 be may be arranged to conduct signals (e.g., transmit signals, receive signals, or both transmit and receive signals) through an independent connection (e.g., a dedicated connection, such as a point-to-point PCIe connection) between IC chip 125 (between device 120) and components on an additional circuit board (e.g., a motherboard) coupled to circuit board 102. The components on the additional circuit board may include a device (e.g., a bus controller device) or a chipset (e.g., a bus controller chipset) coupled to a PCIe bus on the additional circuit board. Conductive contacts 122 may be arranged to conduct signals (e.g., transmit signals, receive signals, or both transmit and receive signals) through another independent connection (e.g., another dedicated connection, such as another point-to-point PCIe connection) between IC chip 125 (between device 120) and components on the additional circuit board.

Conductive contacts 123 may be arranged to conduct signals (e.g., transmit signals, receive signals, or both transmit and receive signals) through an independent connection (e.g., via a network) between IC chip 125 (between device 120 and components (e.g., a device or system) coupled to I/O connector 141. Conductive contacts 124 may be arranged to conduct signals (e.g., transmit signals, receive signals, or both transmit and receive signals) through another independent connection (e.g., via another network) between IC chip 125 (between device 120 and components (e.g., a device or system) coupled to I/O connector 142. The signals conducted through connectors 141 and 142 may be based on different computer network standards (e.g., Ethernet, Fibre Channel, and InfiniBand standards).

In the description above, PCIe card 101 and its components (e.g., PCIe connectors 111 and 112) are described based on PCIe specification as an example. In an alternative arrangement, PCIe card 101 may comply with another standard or specification. Thus, in such an alternative arrangement, alternative connectors (e.g., alternative edge connectors) complying with another standard or specification (different PCIe specification) may replace PCIe connectors 111 and 112. The alternative connectors on the card and the slot on the motherboard (arranged to couple to the alternative connectors) may comply with the same standard or specification.

Figure 2:
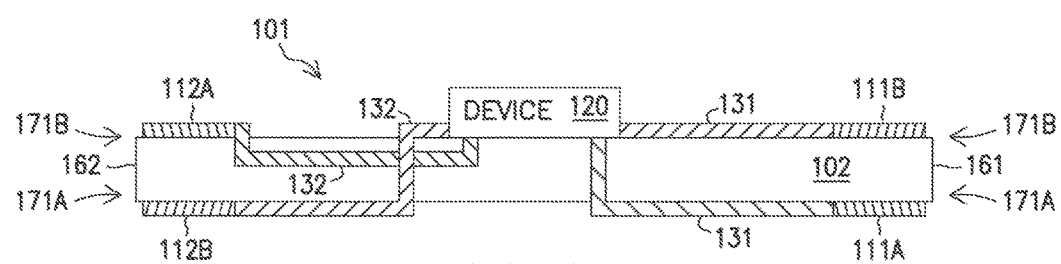
FIG. 2 shows a portion of the PCIe card of FIG. 1 including some conductors of the PCIe connectors, according to some embodiments described herein.

FIG. 2 shows a portion (e.g., a cross-section) of PCIe card 101 of FIG. 1 including the arrangement of some of conductors 111A, 111B, 112A, and 112B of FIG. 1, according to some embodiments described herein. For simplicity, only one of conductors 111A, one of conductors 111B, one of conductors 112A, and one of conductors 112B are shown in FIG. 2.

As can be seen in FIG. 2, one of conductors 111A (coupled to connection 131) and one of conductors 111B (coupled to connection 131) of PCIe connector 111 are located on opposite sides 171A and 171B of circuit board 102 of PCIe card 101. One of conductors 112A (coupled to connection 131) and one of conductors 112B (coupled to connection 132) of PCIe connector 112 are located on opposite sides 171A and 171B of circuit board 102 of PCIe card 101.

As described above with reference to FIG. 1 and as can be seen in FIG. 2, although conductors 111A of PCIe connector 111 and conductors 112A of PCIe connector 112 may have pin names associated with conductors on the solder side (side A) of a PCB based on PCIe connector pin-out, conductors 111A and 112A are located on opposite sides (e.g., sides 171A and 171B) of PCIe card 101. Similarly, although conductors 111B of PCIe connector 111 and conductors 112B of PCIe connector 112 may have pin names associated with conductors on the component side (side B) of a PCB based on PCIe connector pin-out, conductors 111B and 112B are located on opposite sides (e.g., sides 171A and 171B) of PCIe card 101.

Figure 3:
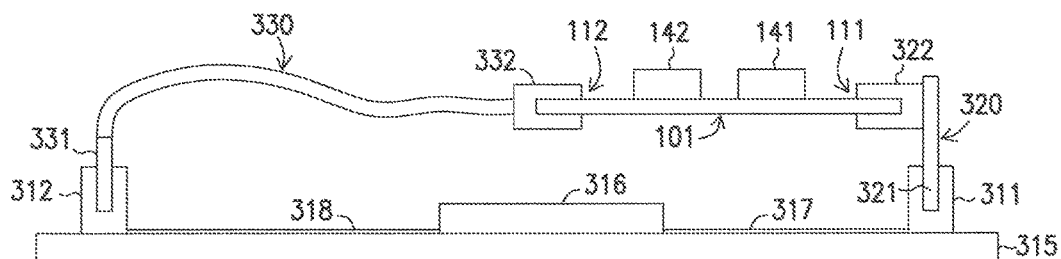
FIG. 3, FIG. 4, and FIG. 5 show different arrangements of the PCIe card of FIG. 1 in different electronic systems, according to some embodiments described herein.
Figure 4:
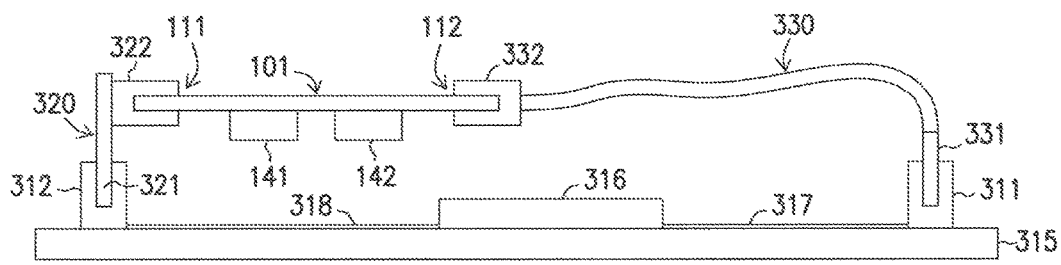
Figure 5:
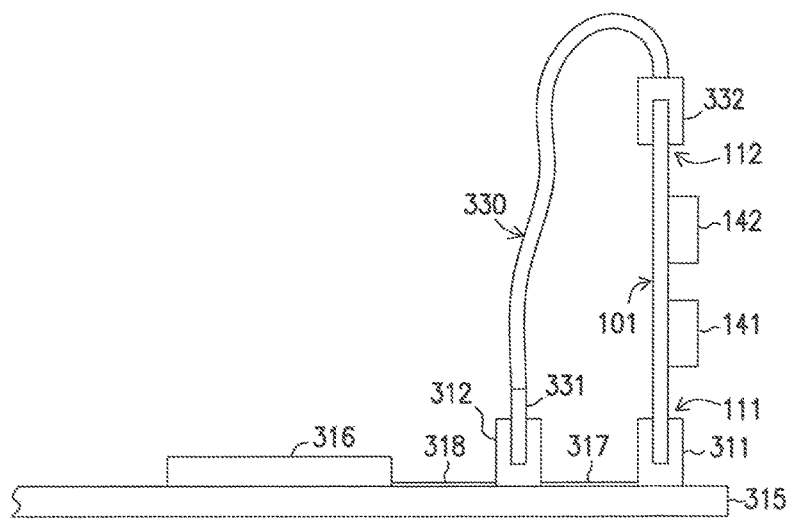

FIG. 3, FIG. 4, and FIG. 5 show different arrangements of PCIe 101 card of FIG. 1 in different systems (e.g., electronic system) 300, 400, and 500, according to some embodiments described herein. Each of systems 300, 400, and 500 may include or be included in a computer (e.g., a server). Systems 300, 400, and 500 may include similar or identical components. Thus, in FIG. 3 FIG. 4, and FIG. 5, the description of similar or identical components is not repeated.

As shown in FIG. 3, system 300 may include a motherboard 315 having PCIe slots 311 and 312 that may be arranged to receive a PCIe card or multiple PCIe cards, Motherboard 315 may include components 316 and a bus (e.g., a PCIe bus) having bus portions 317 and 318 coupled to components 316. Examples of components 316 include a device (e.g., a bus controller device), a chipset (e.g., a bus controller chipset), and other types of devices or chipsets.

FIG. 3 shows an example where PCIe card 101 is arranged in parallel with motherboard 315 (e.g., arranged horizontally). For example, PCIe connectors 111 and 112 may be coupled to PCIe slots 311 and 312 through a PCIe riser (e.g., PCIe riser card) 320 and a PCIe extender cable 330, respectively. PCIe riser 320 may include an end (e.g., male end) 321 coupled to (e.g., inserted into) PCIe slot 311 and an end (e.g., female end) 322 coupled to PCIe connector 111 of PCIe card 101. PCIe extender cable 330 may include an end (e.g., male end) 331 coupled to (inserted into) PCIe slot 312 and an end (e.g., female end) 332 coupled to PCIe connector 112 of PCIe card 101.

In the arrangement of FIG. 3, bus portion 317, conductors 111A and 111B (FIG. 1) of PCIe connector 111, and connection 131 (FIG. 1) may be parts of an independent connection (e.g., a dedicated connection, such as a point-to-point PCIe connection) between components 316 on motherboard 315 and device 120 (FIG. 1). Bus portion 318, conductors 112A and 112B (FIG. 1) of PCIe connector 112, and connection 132 (FIG. 1) may be parts of another independent connection (e.g., another dedicated connection, such as another point-to-point PCIe connection) between components 316 on motherboard 315 and device 120 (FIG. 1).

PCIe connectors 111 and 112 are PCIe compliant components and compatible with standard PCIe form factor connectors. PCIe slots 311 and 312, PCIe riser 320, and PCIe extender cable 330 are also PCIe compliant components and compatible with standard PCIe form factors. Thus, PCIe card 101 having multiple (e.g., dual) PCIe connectors as described herein may be suitable for use in the ecosystem of PCIe components using commercially available PCIe components. Further, since device 120 may support more than one PCIe connector, a conventional PCIe card having single PCIe connector may limit the functionality of device 120. In contrast, PCIe card 101 having multiple PCIe connectors as described herein may allow a device (e.g., device 120) that supports more than one PCIe connector to use full functionality of such a device.

FIG. 4 shows an arrangement of PCIe card 101 in system 400. As shown in FIG. 3 and FIG. 4, PCIe card 101 may be arranged in parallel with motherboard 315. In FIG. 4, however, the arrangement of the components of PCIe card 101 relative to the position of motherboard 315 can be viewed as being arranged "up-side" down in comparison with the arrangement (e.g., "right-side" up) of the components of PCIe card 101 of FIG. 3. As shown in FIG. 4, PCIe connector 111 of PCIe card 101 may be coupled to PCIe slot 312 through PCIe riser 320. PCIe connector 112 of PCIe card 101 may be coupled to PCIe slot 312 through PCIe extender cable 330.

In the arrangement of FIG. 4, bus portion 318, conductors 111A and 111B (FIG. 1) of PCIe connector 111, and connection 131 (FIG. 1) may be parts of an independent connection (e.g., a dedicated connection, such as a point-to-point PCIe connection) between components 316 on motherboard 315 and device 120 (FIG. 1). Bus portion 317, conductors 112A and 112B (FIG. 1) of PCIe connector 112, and connection 132 (FIG. 1) may be parts of another independent connection (e.g., another dedicated connection, such as another point-to-point PCIe connection) between components 316 on motherboard 315 and device 120 (FIG. 1).

FIG. 5 shows an arrangement of PCIe card 101 in system 500. As shown in FIG. 3 and FIG. 5, the distance between slots 311 and 312 of system 500 (FIG. 5) may be less than that of the distance between PCIe slots 311 and 312 of system 30 (FIG. 3). Thus, in FIG. 5, PCIe card 101 may be arranged perpendicular to (e.g., vertically from) motherboard 315. In this arrangement, PCIe connector 111 of PCIe card 101 may be coupled (e.g., directly coupled) to PCIe slot 311 without going through a PCIe riser. PCIe connector 112 of PCIe card 101 may be coupled to PCIe slot 312 through PCIe extender cable 330.

In the arrangement of FIG. 5, bus portion 317, conductors 111A and 111B (FIG. 1) of PCIe connector 111, and connection 131 (FIG. 1) may be parts of an independent connection (e.g., a dedicated connection, such as a point-to-point PCIe connection) between components 316 on motherboard 315 and device 120 (FIG. 1). Bus portion 318, conductors 112A and 112B (FIG. 1) of PCIe connector 112, and connection 132 (FIG. 1) may be parts of another independent connection (e.g., another dedicated connection, such as another point-to-point PCIe connection) between components 316 on motherboard 315 and device 120 (FIG. 1).

FIG. 6 is a flowchart showing a method of making a PCIe card, according to some embodiments described herein. The PCIe card made by method 600 may include PCIe card 101 described above with reference to FIG. 1 through FIG. 5.

As shown in FIG. 6, activity 610 of method 600 may include forming a group of conductors of a PCIe connector on a side (e.g., top side) of a circuit board. Activity 620 may include forming another group of conductors of the PCIe connector on another side (e.g., bottom side) of the circuit board. Activity 630 may include forming a group of conductors of an additional PCIe connector on one of the sides (e.g., bottom side) of the circuit board. Activity 640 may include forming another group of conductors of the additional PCIe connector on the other side (e.g., top side) of the circuit board.

Some or all of activities 610, 620, 630, and 640 may be performed concurrently (e.g., simultaneously). For example, activities 610 and 640 may be performed concurrently, such that one group of conductors of each of the PCIe connectors (e.g., conductors 111B and 112A of FIG. 1) may be formed at the same time. In another example, activities 620 and 630 may be performed concurrently, such that another group of conductors of each of the PCIe connectors (e.g., conductors 111A and 112B of FIG. 1) may be formed at the same time. In a further example, activities 610, 620, 630, and 640 may be performed concurrently, such that all of the conductors of the PCIe connectors may be formed at the same time.

Method 600 may include other activities besides activities 610, 620, 630, and 640, such as attaching a device (e.g., device 120 of FIG. 1) on the circuit board, forming I/O connectors (e.g., I/O connectors 141 and 142 of FIG. 1), forming connections (e.g., connections 131, 132, 133, and 134), and other activities, so that the PCIe card made by method 600 may include components similar to or identical to those of PCIe card 101 described above with reference to FIG. 1 through FIG. 5.

The illustrations of the apparatuses (e.g., PCIe card 101 and systems 300, 400, and 500) and methods (e.g., method 600) described above are intended to provide a general understanding of the structure of different embodiments and are not intended to provide a complete description of all the elements and features of an apparatus that might make use of the structures described herein.

The apparatuses and methods described above may include or be included in high-speed computers, communication and signal processing circuitry, single or multi-processor modules, single or multiple embedded processors, multicore processors, message information switches, and application-specific modules including multilayer, multichip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Additional Notes and Examples

Example 1 includes subject matter (such as a device, circuit apparatus or electronic system apparatus, or machine) including a circuit board, a device located on the circuit board, a first Peripheral Component Interconnect Express (PCIe) connector located on the circuit board and coupled to the device, the first PCIe connector arranged to couple to a first connector of an additional circuit board, and a second PCIe connector located on the circuit board and coupled to the device, the second PCIe connector arranged to couple to a second connector of the additional circuit board.

In Example 2, the subject matter of Example 1 may optionally include, wherein the first connector of the additional circuit board includes a first PCIe slot, and the second additional connector of the additional circuit board includes a second PCIe slot.

In Example 3, the subject matter of Example 1 may optionally include, wherein the circuit board includes a first edge and a second edge, the conductors of the first connector are located at the first edge, and the conductors of the second connector are located at the second edge.

In Example 4, the subject matter of Example 3 may optionally include, wherein the first edge is opposite from the second edge.

In Example 5, the subject matter of Example 1 may optionally include, wherein each of the first and second PCIe connectors includes the conductors, the conductors of first PCIe connector include a first group of conductors on a first side of the circuit board, and a second group of conductors on a second side of the circuit board, the conductors of the second PCIe connector include a first group of conductors on the second side of the circuit board, and a second group of conductors on the first side of the circuit board, and the first group of conductors of each of the first and second PCIe connectors is arranged based on PCIe connector pin-out specification for a first side of a printed-circuit-board (PCB), and the second group of conductors of each of the first and second PCIe connectors is arranged based on PCIe connector pin-out specification for a second side of the PCB.

In Example 6, the subject matter of Example 1 may optionally include a first additional connector located on the circuit board and coupled to the device, the first additional connector arranged to conduct signals based on a first computer network standard, and a second additional connector located on the circuit board and coupled to the device, the second additional connector arranged to conduct signals based on a second computer network standard.

In Example 7, the subject matter of any one of Example 6 may optionally include, wherein the circuit board includes a first edge, a second edge, and a third edge, the first PCIe connector includes conductors located at the first edge, and the second PCIe connector includes conductors located at the second edge, and the first and second additional connectors are located at the third edge.

In Example 8, the subject matter of any one of Example 1 may optionally include, wherein the circuit board, the device, and the first and second PCIe connectors are parts of an expansion card.

In Example 9, the subject matter of any one of Example 8 may optionally include, wherein the expansion card includes one of a host adapter device, a network interface controller (NIC) device, or a converged network adapter device.

In Example 10, the subject matter of Example 8 may optionally include, wherein the expansion card conforms to a PCIe form factor.

Example 11 includes subject matter (such as a device, circuit apparatus or electronic system apparatus, or machine) including an integrated circuit (IC) chip, first conductive contacts of the IC chip arranged to couple to a first Peripheral Component Interconnect Express (PCIe) connector of a PCIe card, and second conductive contacts of the IC chip arranged to couple to a second PCIe connector of the PCIe card.

In Example 12, the subject matter of Example 11 may optionally include, wherein the first conductive contacts are arranged to conduct signals through a first point-to-point PCIe connection between the IC chip and one of components on a circuit board coupled to the IC chip through the first PCIe connector, and the second conductive contacts are arranged to conduct signals through a second point-to-point PCIe connection between the chip and one of the components on the circuit board coupled to the IC chip through the second PCIe connector.

In Example 13, the subject matter of Example 11 may optionally include third conductive contacts arranged to couple to a first input/output (I/O) connector of the PCIe card, fourth conductive contacts arranged to couple to a second I/O connector of the PCIe card.

In Example 14, the subject matter of Example 13 may optionally include, wherein the third conductive contacts are arranged to conduct signals from a first computer network through the first I/O connector of the PCIe card, and the fourth conductive contacts are arranged to conduct signals from a second computer network through the first I/O connector of the PCIe card.

In Example 15, the subject matter of Example 13 may optionally include, wherein the first, second, third, and fourth conductive contacts include one of solder balls and conductive pins.

Example 16 includes subject matter (such as a device, circuit apparatus or electronic system apparatus, or machine) including a circuit board including a first Peripheral Component Interconnect Express (PCIe) slot and a second PCIe slot, and a PCIe card including a device, a first PCIe connector coupled to the device and the first PCIe slot, a second PCIe connector coupled to the device and the second PCIe slot, a first input/output (I/O) connector coupled to the device, and a second I/O connector coupled to the device.

In Example 17, the subject matter of Example 16 may optionally include, wherein the first PCIe connector is coupled to the first PCIe slot through a PCIe riser, and the second PCIe connector is coupled to the second PCIe slot through a PCIe extender cable.

In Example 18, the subject matter of Example 16 may optionally include, wherein the PCIe card is arranged in parallel with the circuit board.

In Example 19, the subject matter of Example 16 may optionally include, wherein the PCIe card is arranged perpendicular to the circuit board.

Example 20 includes subject matter including a method of making a Peripheral Component interconnect Express card, the method comprising forming a first group of conductors of a Peripheral Component Interconnect Express (PCIe) connector on a first side of a circuit board, forming a second group of conductors of the first PCIe connector on a second side of the circuit board, forming a first group of conductors of a second PCIe connector on the second side of the circuit board, and forming a second group of conductors of the second PCIe connector on the first side of the circuit board.

In Example 21, the subject matter of Example 20 may optionally include, wherein the first group of conductors of each of the first and second PCIe connectors are formed based on PCIe connector pin-out specification for a first side of a printed-circuit-board (PCB), and the second group of conductors of each of the first and second PCIe connectors are formed based on PCIe connector pin-out specification for a second side of the PCB.

In Example 22, the subject matter of Example 20 may optionally include, wherein the first and second groups of conductors of the first PCIe connector are formed at a first edge of the circuit board, the first and second groups of conductors of the second PCIe connector are formed at a second edge of the circuit board, and the second edge is opposite from the first edge.

The subject matter of Example 1 through Example 22 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising a semiconductor chip comprising:
    a multicore processor;
    a network interface controller (NIC);
    a first connector to couple to a first Peripheral Component Interconnect Express (PCIe) connector of one or more devices;
    a second connector to couple to a second PCIe connector of one or more devices;
    a third connector to couple to an InfiniBand network; and
    a fourth connector to couple to an Ethernet network.

2. The apparatus of claim 1, wherein the first connector comprises a first set of conductors and the second connector comprises a second set of conductors.

3. The apparatus of claim 2, wherein the first and second sets of conductors are arranged based on PCIe connector pin-out specification.

4. A system comprising:
    one or more devices comprising a first Peripheral Component Interconnect Express (PCIe) connector;
    a chip comprising:
        a multicore processor;
        a network interface controller (NIC);
        a first connector to couple to the first PCIe connector;
        a second connector to couple to a second PCIe connector;
        a third connector to couple to an InfiniBand network; and
        a fourth connector to couple to an Ethernet network.

5. The system of claim 4, wherein the first connector comprises a first set of conductors and the second connector comprises a second set of conductors.

6. The system of claim 5, wherein the first and second sets of conductors are arranged based on PCIe connector pin-out specification.

* * * * *